United States Patent
Yamazaki et al.

(10) Patent No.: US 9,215,047 B2
(45) Date of Patent: Dec. 15, 2015

(54) SIGNAL PROCESSING DEVICE AND METHOD BY USE OF WIRELESS COMMUNICATION

(75) Inventors: Ryota Yamazaki, Tokyo (JP); Ken Takei, Tokyo (JP); Tsutomu Yamada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/410,715

(22) PCT Filed: Jun. 28, 2012

(86) PCT No.: PCT/JP2012/066525
§ 371 (c)(1),
(2), (4) Date: Dec. 23, 2014

(87) PCT Pub. No.: WO2014/002226
PCT Pub. Date: Jan. 3, 2014

(65) Prior Publication Data
US 2015/0172009 A1    Jun. 18, 2015

(51) Int. Cl.
    H04L 1/24    (2006.01)
    H03M 7/30    (2006.01)
    H04L 1/00    (2006.01)
    H04N 19/42    (2014.01)

(52) U.S. Cl.
    CPC .................. *H04L 1/243* (2013.01); *H03M 7/30* (2013.01); *H03M 7/6041* (2013.01); *H04L 1/0036* (2013.01); *H04L 1/0091* (2013.01); *H04N 19/42* (2014.11)

(58) Field of Classification Search
    None
    See application file for complete search history.

(56) References Cited

U.S. PATENT DOCUMENTS

| | | |
|---|---|---|
| 6,658,382 B1 | 12/2003 | Iwakami et al. |
| 2001/0024468 A1* | 9/2001 | Miyashita et al. ............ 375/228 |
| 2005/0043893 A1* | 2/2005 | Hickey ............................ 702/19 |
| 2006/0004566 A1 | 1/2006 | Oh et al. |

FOREIGN PATENT DOCUMENTS

| | | |
|---|---|---|
| JP | 2000-338998 A | 12/2000 |
| JP | 2006-11456 A | 1/2006 |
| JP | 2011-176429 A | 9/2011 |

OTHER PUBLICATIONS

International Search Report (PCT/ISA/210) dated Sep. 25, 2012, with English translation (seven (7) pages).

* cited by examiner

Primary Examiner — Leon-Viet Nguyen
(74) Attorney, Agent, or Firm — Crowell & Moring LLP

(57) ABSTRACT

It is an object to provide signal processing device and method by use of wireless communication, which is capable of analyzing status of the wireless communication in detail at a later date, compressing a wireless signal such that it can be reproduced, and reproducing the compressed signal to perform its re-reception. The signal processing device includes a reception processing unit that performs reception processing of a received signal wirelessly, a signal recording unit that records the signal, a signal compression unit that compresses an information amount of the received signal, and a signal output unit that stores the received signal that has been compressed or outputs the same to an external device. The signal compression unit divides a signal, obtained by frequency-transforming the wireless received signal, into a signal portion large in amplitude value and a non-signal portion small in amplitude value on a frequency spectrum, calculates a representative value based on a feature quantity of the non-signal portion and combines the signal portion and the representative value into a compressed signal.

9 Claims, 9 Drawing Sheets

SIGNAL PROCESSING DEVICE AND METHOD BY USE OF WIRELESS COMMUNICATION

TECHNICAL FIELD

The present invention relates to signal processing device and method by use of wireless communication, and particularly to those suitable for taking a form appropriate for analysis and reproduction of a received signal at a later date by compressing and storing the received signal.

BACKGROUND ART

In a technical field of wireless communication, a signal received wirelessly may be stored and used in reproduction processing at a later date. Since a large storage capacity is needed as a storage period becomes longer in this case, it is useful to compress and store the received signal.

As a technique for compressing and storing the signal received wirelessly, a Patent Document 1 is well known. The Patent Document 1 describes that a time-frequency transform of the received signal is performed on a wireless received signal to make a determination as to whether it is a non-signal, on the basis of the spectral amplitude value of a frequency spectrum, and the signal whose band has been determined to be the non-signal is compressed.

PRIOR ART DOCUMENT

Patent Documents

Patent Document 1: JP-2011-176429-A

SUMMARY OF INVENTION

Problems to be Solved by the Invention

There has been described in the Patent Document 1 a mechanism for receiving a wideband signal without use of a band-pass filter BPF and information-compressing a non-signal portion of the signal after its frequency transform. This configuration aims to compress the information amount of the signal and reduce the information amount transmission to the outside. In the method of the Patent Document 1, since the portion determined to be of the non-signal is information-compressed, the signal turns out to be a different one from the original one.

Accordingly, the method is not suitable for the purpose of analyzing a receiving circuit or a reception status thereof by receiving a signal that has been recorded once in the same way again. Specifically, since information contained in a portion determined to be a non-signal portion is lost in a recording signal that has been subjected to compression, it is not possible to perform a test requiring reproducibility by receiving each signal in the same status.

Therefore, the present invention aims to provide signal processing device and method by use of wireless communication, which are capable of analyzing status of wireless communication in detail at a later date, compressing a wireless signal in such a manner that it can be reproduced, and reproducing the compressed signal to perform its re-reception.

Means for Solving the Problems

In order to solve the above problems, a signal processing device by use of wireless communication of the present invention includes a plurality of means for solving the above problems. Being cited one example thereof, it includes a reception processing unit that performs reception processing of a received signal wirelessly, a signal recording unit that records the signal, a signal compression unit that compresses an information amount of the received signal, and a signal output unit that stores the received signal that has been compressed or outputs the same to an external device. The device is wherein the signal compression. unit divides a signal obtained by frequency-transforming the wireless received signal into a signal portion large in amplitude value and a non-signal portion small in amplitude value on a. frequency spectrum, calculates a representative value based on a feature quantity of the non-signal portion and combines the signal portion and the representative value into a compressed signal.

Further, a signal processing method by wireless communication of the present invention is comprising dividing a signal, obtained by frequency-transforming a wireless received signal, into a signal portion large in amplitude value and a non-signal portion small in amplitude value on a frequency spectrum, calculating a representative value based on a feature quantity of the non-signal portion, and outputting the signal portion and the representative value as a compressed signal.

Advantages of the Invention

According to the present invention, it is possible to compress an information amount of a received wireless signal, restore the compressed signal to a reproduced signal with high reproducibility and subject the reproduced signal to reception processing again. This function achieves, for example, a failure analysis and preventive maintenance of a wireless communication system and contributes to the construction of social infrastructure that is secure and safe.

Problems, configurations and advantages other than what has been described above will be more apparent from the following description of embodiments.

MODE FOR CARRYING OUT THE INVENTION

Figure 1:
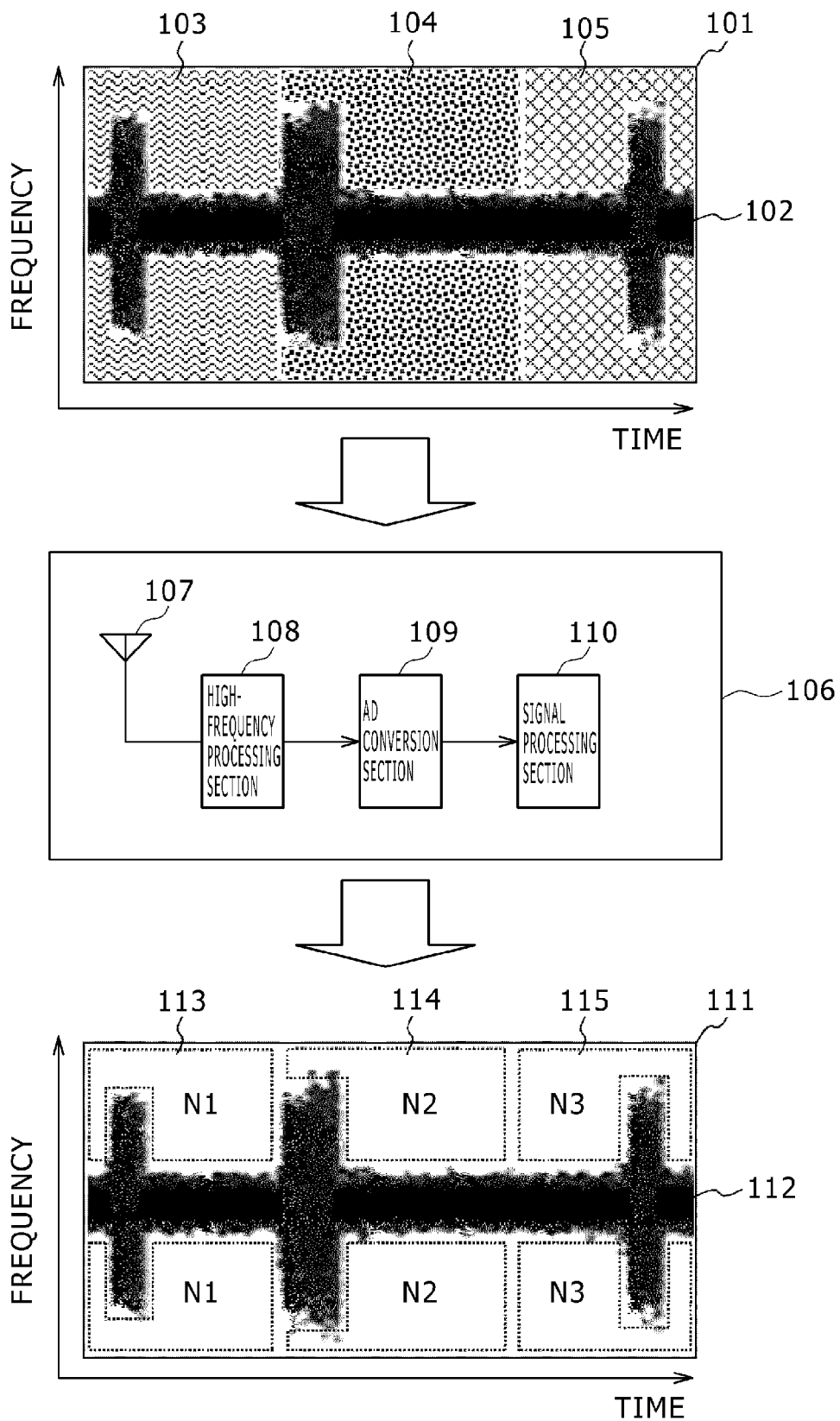
FIG. 1 is a diagram showing an overall configuration of a wireless communication device of an embodiment 1 and its input/output.

Each of the following embodiments will be explained while being divided into multiple sections or embodiments as necessary for the sake of convenience. The number of elements (including numerical values, amount, and ranges) of the following embodiments, when referred to, is not limited to a. certain, quantity except as clearly expressed. or essentially obviously restricted to a specified one the number can be larger or smaller than the specified one. Moreover, the elements (including processing steps) of the following embodiments are not necessarily requisite except as clearly expressed. or essentially obviously so.

Note also that some or all of the components, functions, processors, and the like in the following embodiments can be substituted by other hardware such as an integrated circuit. Alternatively, these components and the others can be implemented by software, which is programs in computers, as well. All the information. associated with the programs, data tables, files, and others that achieve those components, functions, and processors can be stored in data storage devices including a memory, hard disk, and solid state drive (SSD) or portable storage media such as an integrated circuit card (ICC), SD card, and DVD.

Embodiments of the present invention will hereinafter be described in detail on the basis of the drawings. Incidentally, in all the drawings for describing the embodiments, the same or related reference numerals are attached to components having the same function, and their repetitive description will be omitted. Further, the description of the same or like parts will not be repeated in principle in the following embodiments except when particularly necessary.

Embodiment 1

A signal processing device and method by use of wireless communication of the present invention will be described below. In the following description, the signal processing device by use of wireless communication will be simply called a wireless communication device.

An overall configuration of a wireless communication device 106 according to an embodiment 1 and its input/output are shown in FIG. 1. Not only a so-called terminal device but also a relay station device and a base station device are included in the wireless communication device 106. A measuring device used in inspection or analysis may be included in the wireless communication device in the present description. in the present embodiment, a description will be made about the wireless communication device 106 capable of compressing an information amount of a received input signal 101 and outputting an output signal 111 with a reduced information amount.

The wireless communication device 106 whose configuration is indicated in the middle stage of FIG. 1 is comprised of an antenna 107, a high-frequency processing section 108, an AD conversion section 109, and a reception processing section 110.

The antenna 101 receives a wireless signal. The high-frequency processing section 102 is a high frequency circuit that performs amplification of the received wireless signal and down-conversion to a baseband. The AD conversion section 103 analog/digital-converts the baseband signal received from the high-frequency processing section 102. The reception processing section 105 performs a series of reception processing such as synchronization, equalization, demodulation and decoding, and information-compression processing of the received signal on the received signal 101.

The wireless input signal 101 to be received and handled by the wireless communication device 106 is shown in the upper stage of FIG. 1 with the frequency on the longitudinal axis and the time on the lateral axis. The input signal 101 is divided. into a signal portion 102 high in power value and non-signal portions 103, 104 and 105 low in power value. In this example, even in the case of the non-signal portions 103, 104 and 105, it is assumed that there is a difference in power level therebetween, and the input signal 101 is classified into the non-signal portions 103, 104 and 105 according to the difference between the power levels.

An output signal 111 after being processed by the wireless communication device 106 is shown in the lower stage of FIG. 1 with the frequency on the longitudinal axis and the time on the lateral axis. The output signal 111 is divided into a signal portion 112 high in power value and representative values 113, 114 and 115 of the non-signal portion.

The signal portion 112 has the same information amount as that of the signal portion 102 of the input signal 101. On the other hand, the representative values 113, 114 and 115 of the non-signal portion respectively correspond to the non-signal portions 103, 104 and 105 of the input signal 101 and are taken as values transformed into the respective single representative values 113, 114 and 115 on the basis of feature quantities that the non-signal portions 103, 104 and 105 have.

Figure 2:
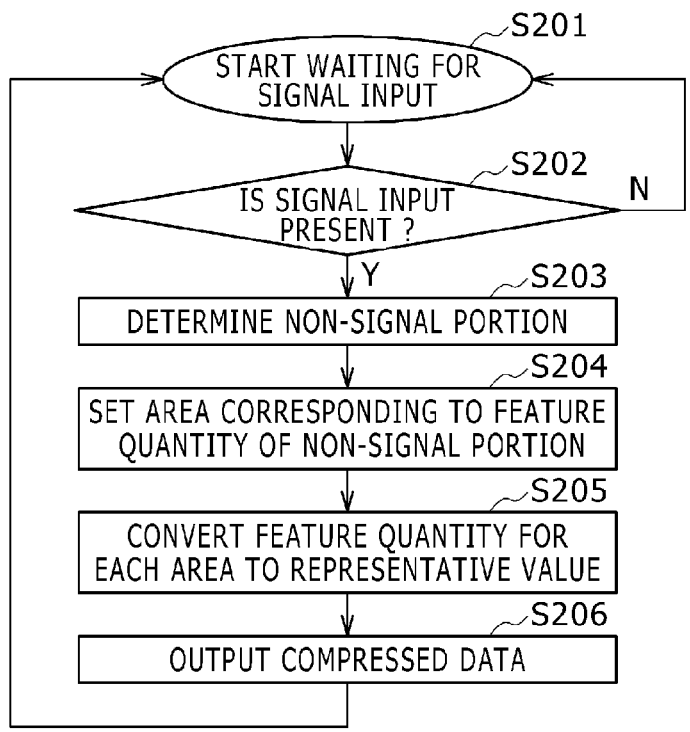
FIG. 2 is a flowchart for describing a processing operation example of the wireless communication device of the embodiment 1.

FIG. 2 shows one example of a processing operation procedure of the wireless communication device 106 in FIG. 1. After being powered on, the wireless communication device 106 starts a wait state of a signal input (process S201). Once an increase of some power level is sensed, it is determined whether the increase is the input of a desired wireless signal (process S202). When it is determined not to be the desired signal (N of process S201), the wireless communication device 106 returns to be waiting for the signal input again (process S201).

When it is determined to be the desired signal (Y of process S201), the wireless communication device 106 determines the data portion determined to be a non-signal at its input signal (process S203). However, the input signal to be handled here is 101 of FIG. 1, which is a signal obtained by transforming the received signal into a signal in a frequency domain. Next, the data portion is further divided finely according to the signal strength of the non-signal portion (process S204). Next, the divided data portions are converted into representative values corresponding to the feature quantities of the data portions (process S205). Next, the data portion of the signal portion and the respective representative values transformed are combined into compressed data, which is then output (process S206).

The processing to be described, here will be explained with a specific example. The input obtained. from the antenna 107 during time t1 to t2, for example is transformed into a signal for each frequency band by means of the Fourier transform, for example. Then, for example, a frequency band in which the average magnitude of the signal is less than a predetermined value LU is taken to be a non-signal portion, and a frequency band exceeding the value is taken to be a signal portion. For the frequency band determined to be the signal portion, its data is held as it is as a time-frequency signal. For the frequency band determined to be the non-signal portion, it is held as a signal of an average magnitude. The fact that the frequency band is held as the signal of the average magnitude corresponds to the fact that the signal of the average magnitude is transformed and compressed into representative value according to the feature quantity of the data portion.

After the above processing for the signal portion and the non-signal portion is carried out for all frequency bands, and the determination in the whole frequency band is completed, the same process is repeatedly carried out by changing the time domain. to the next time domain (from t2 to t3). According to such a series of time-series processing, the input signal is held as it is for the signal portion. In contrast, for each non-signal. portion, the representative values in each time domain are held and stored as data strings in a time series.

With the processing operations described above, the wireless communication device 106 according to the embodiment 1 determines the non-signal portion from the input signal and replaces it with one representative value to thereby enable the information amount of the output signal 111 to be smaller than the information amount of the input signal 101 by making the output signal as a combination of the representative values of the signal portion. and the non-signal portion. That is, it is possible to compress the information amount of the received wireless signal.

Since the signal portion of the compressed output signal 111 is equivalent to the signal portion of the input signal 101, the information amount can be compressed while reproducibility of the input signal 101 is remaining high. Moreover, for the non-signal portion of the compressed output signal 111, the non-signal portion represented as the data string in the time series is replaced with one representative value. Therefore, a higher compression rate can be achieved than in the normal information-compression processing.

For the non-signal portion of the compressed output signal 111, it is held as one representative value, so that reproducibility can be improved even when the output signal 111 is restored into the original input signal 101. This is because the non-signal portion has an information amount as noise power, and the SN ratio will be improved compared to the input signal when it is removed completely. The reproducibility however becomes worse.

Embodiment 2

Figure 3:
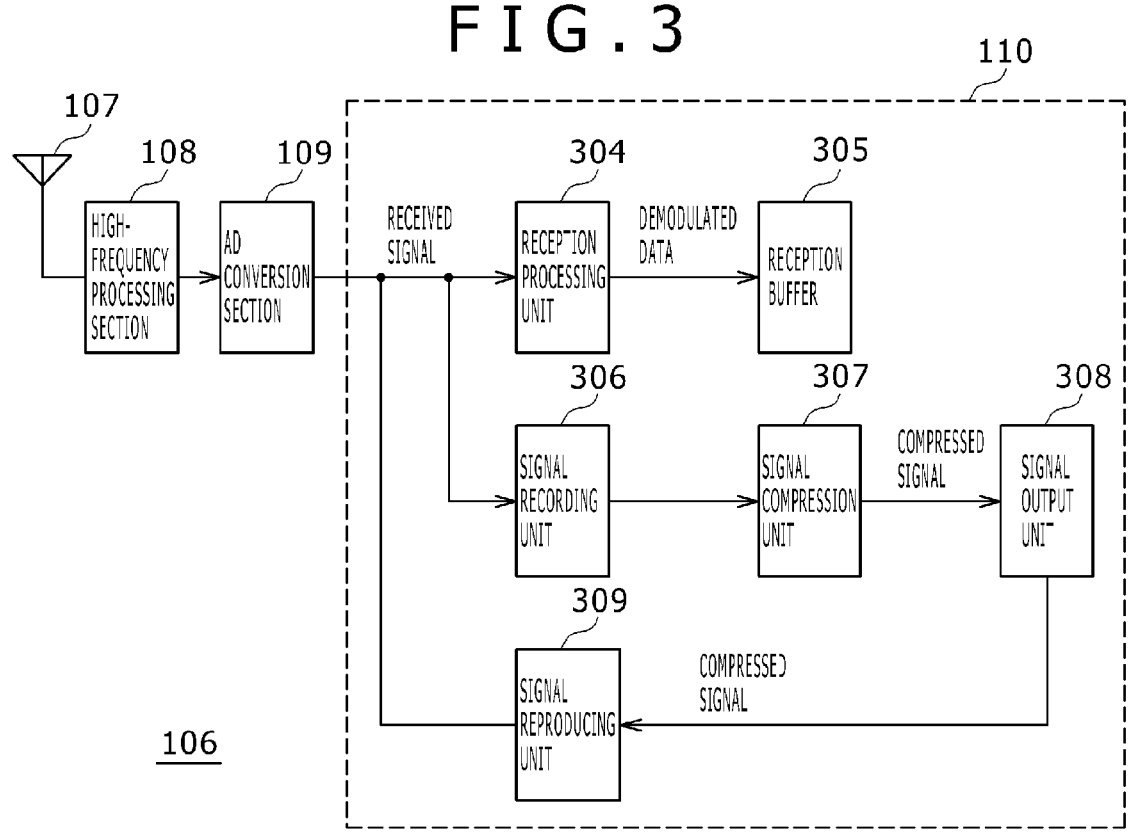
FIG. 3 is a diagram showing a functional configuration example of a wireless communication device of an embodiment 2.

FIG. 3 shows an overall configuration of a wireless communication device 106 according to an embodiment 2 and its input/output. The embodiment 2 shown a more detailed functional configuration than the embodiment 1 does for the configuration of the wireless communication device 106. In the wireless communication device 106 shown in FIG. 3, an antenna 107, a high-frequency processing section 108 and an AD conversion section 109 are those identical to those illustrated. in FIG. 1. The configuration of the signal In FIG. 3, the signal processing section 110 of FIG. 1 is comprised of a reception processing unit 304, a reception. buffer 305, a signal recoding unit 306, a signal compression unit 307, a signal output unit 308, and a signal reproducing unit 309.

Of these, the reception processing unit 304 performs a series of reception processing such as synchronization, equalization, demodulation and decoding on the received signal. The reception buffer 305 receives the data after the reception processing unit 304 has demodulated it and then delivers it to an upper level application or an external device. The signal recording unit 306 is a device that records the received wireless signal in a recording medium or region. The signal compression unit 307 performs information-compression processing on the recorded wireless signal. The signal output unit 308 has the function of receiving the recorded wireless signal and the compressed signal subjected to information-compression and storing it in a recoding medium or region or outputting or transferring it to an external device. The signal reproducing unit 309 receives the compressed signal from the signal output unit 308 and starts reproduction processing on the compressed signal.

The details of signal compression processing will be described below in reference to FIGS. 4, 5 and 6.

Figure 4:
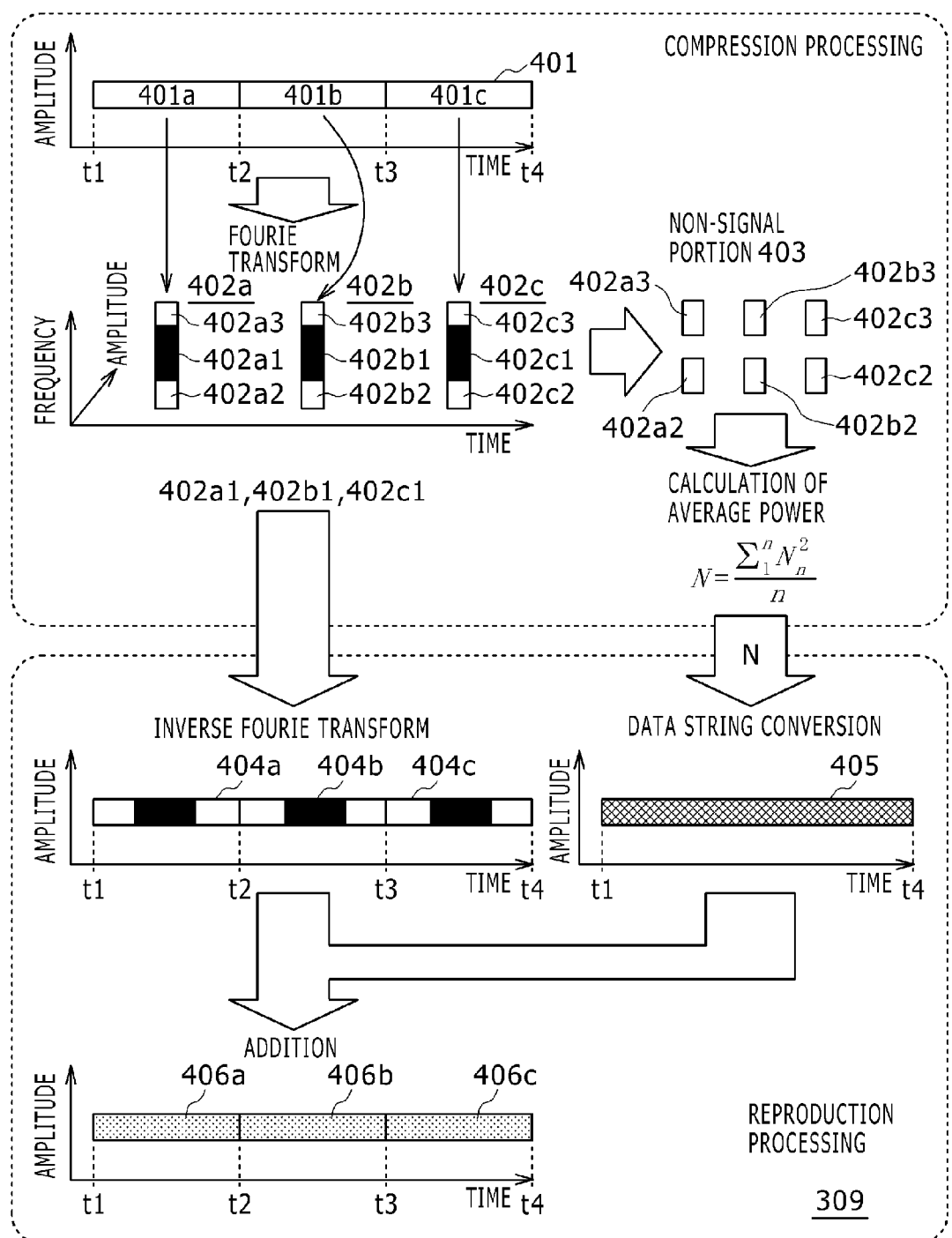
FIG. 4 is a diagram for describing a processing operation example of the wireless communication device of the embodiment 2.

FIG. 4 typically shows one example of a procedure for the compression. processing and reproduction processing of the wireless communication device 106 in FIG. 3. First, an input signal taken from the antenna 107 is represented as a time domain data string 401 with the amplitude value taken in each data element. The time domain data string 401 includes, for example, a time domain data string 401*a* observed during time t1 to t2, a time domain data string 401*b* observed during time t2 to t3, and a time domain data string 401*c* observed during time t3 to t4.

The time domain data string 401 is multiplied by a window function and applied with frequency transform processing such as Fourier transform. Thus, the time domain data string 401 is transformed to a frequency domain data string 402 with the amplitude value as a frequency spectrum taken in each data element. A frequency domain data string obtained from the time domain data string 401*a* observed during time t1 to t2 is 402*a*. A frequency domain data string obtained from the time domain data string 401*b* observed during time t2 to t3 is 402*b*. A frequency domain data string obtained from the time domain data string 401*c* observed during time t3 to t4 is 402*c*.

In the frequency domain data string 402, partial data strings greater than or equal to the threshold and partial data strings less than or equal to the threshold are determined. In the case of the frequency domain data string 402*a* illustrated in FIG. 4, a blackened portion (402*a*1) of the frequency band is the partial data string greater than or equal to the threshold, and unblackened portions (402*a*2 and 402*a*3) of the frequency band are the partial data strings less than or equal to the threshold.

Likewise, partial data strings greater than or equal to the threshold and partial data strings less than or equal to the threshold are determined similarly even with respect to the frequency domain data string 402*b* obtained from the input at the next time and the frequency domain data string 402*c* at the next time. Signal portions in this case are 402*b*1 and 402*c*1, and non-signal portions are 402*b*2, 402*b*3, 402*c*2 and 402*c*3.

A non-signal portion. data string obtained by determining the partial data strings (e.g., 402*a*2 and 402*a*3) less than or equal to the threshold with respect to a plurality of frequency domain data strings 402 is assumed to be 403. In the case of the non-signal portion data string 403 illustrated in FIG. 4, there is shown an example in which the non-signal portion. data string 403 is formed by the partial data strings 402*a*2 and 402*a*3 less than or equal to the threshold derived from the input during time t1 to t2, the partial data strings 402*b*2 and 402*b*3 less than or equal to the threshold derived from the input during time t2 to t3, and the partial data strings 402*c*2 and 402*c*3 less than or equal to the threshold derived from the input during time t3 to t4. In this example, the non-signal portion data string 403 shows an example made from the three consecutive frequency domain data strings 402.

An average power value N of the data string of the non-signal portion data string 403 is calculated. The average power value N is taken to be a representative value of the non-signal data string 403. The frequency domain. data strings 402*a*1, 402*b*1 and 402*c*1 from which the non-signal portions are removed, and the average power value N are combined. into the compressed signal.

The above is the contents (307) of the compression processing of FIG. 4. This processing result is used in the reproduction processing (309).

A procedure to perform reproduction processing on the compressed signal will now be described with reference to FIG. 4. Here, the frequency domain data strings 402a1, 402b1 and 402c1 from which the non-signal portions are removed are first subjected to inverse Fourier transform to be taken as a time domain data string 404. The time domain data string 404 includes, for example, a time domain data string 404a corresponding to the time domain data string 401a observed during time t1 to t2, a time domain data string 404b corresponding to the time domain data string 401b observed during time t2 to t3, and a time domain data string 404c corresponding to the time domain data string 401c observed during time t3 to t4. However, the reproduced time domain data strings 404a, 404b and 404c are not yet reflective of the status of the non-signal portions.

Therefore, in the present invention, a non-signal portion data string 405 is next obtained on the basis of the average power value N. The non-signal portion data string 405 is reproduced as an average power value between the times t1 and t4. The time domain data string 404 and the non-signal portion data string 405 are added to assume a reproduced signal data string 406.

Incidentally, the above processing shown in FIG. 4 is processing on the basis of the inputs obtained during time t1 to t4. The following processing is sequentially performed on each new input within the time range defined in the same manner.

Figure 5:
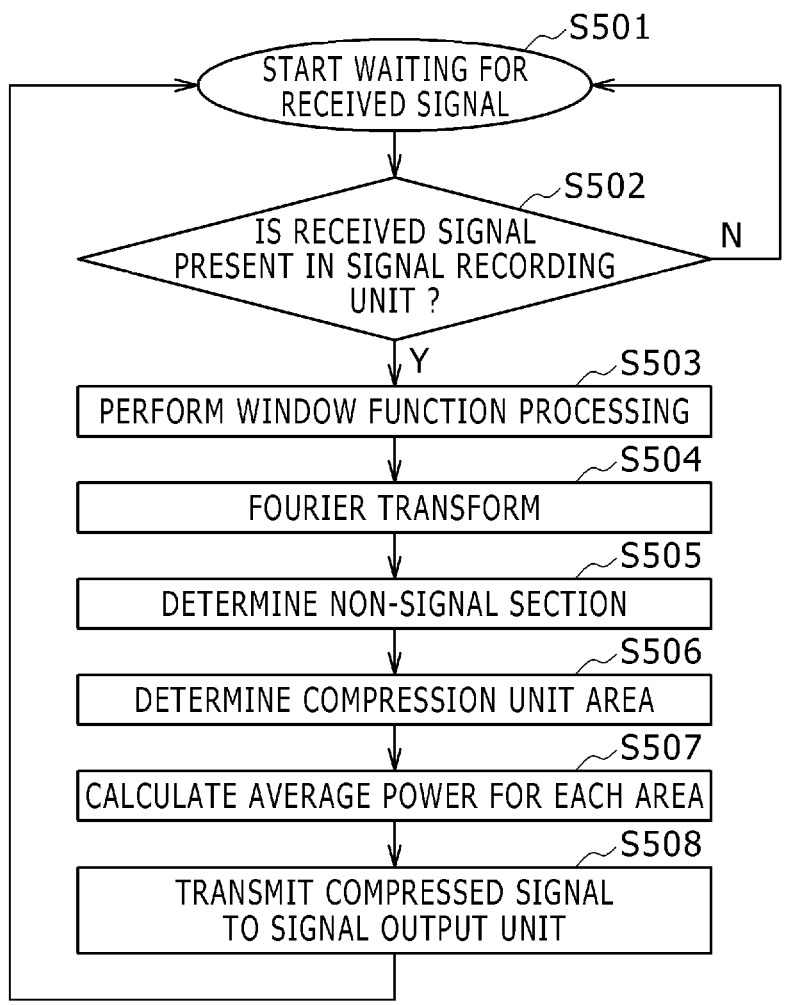
FIG. 5 is a flowchart for describing a processing operation example of a signal compression unit of the wireless communication device of the embodiment 2.

FIG. 5 shows one example of a processing operation procedure of the signal compression unit 307 in the wireless communication device 106 of FIG. 3.

After being powered on, the wireless communication device 106 starts a standby state for recording of the received signal (process S501). When it is not sensed that the signal recording unit 306 has recorded the received signal (N of process S502), the signal compression unit 307 returns to be waiting for the received signal again (process S501)

Once the signal recording is sensed (Y of process S502), the signal compression. unit 307 starts the compression processing of the received signal that has been recorded. First, the recorded received signal 401 is multiplied by a window function (process S503). Next, the recorded signal 401 is transformed to a data string 402 in the frequency domain by being subjected to Fourier transform (process S504).

Next, a data string 403 of non-signal portions is determined with respect to the frequency domain data string 402 (process S505). Further, the determined non-signal portion data string 403 is divided into partial data strings each corresponding to a power level (process S506). Next, the average power value N is calculated for each partial data string (process S507). Frequency domain data strings 402a1, 402b1 and 402c1 from which the non-signal portions are removed, and the calculated plural average power values N are combined into a compressed signal, which is then sent to the signal output unit 308 (process S508).

Figure 6:
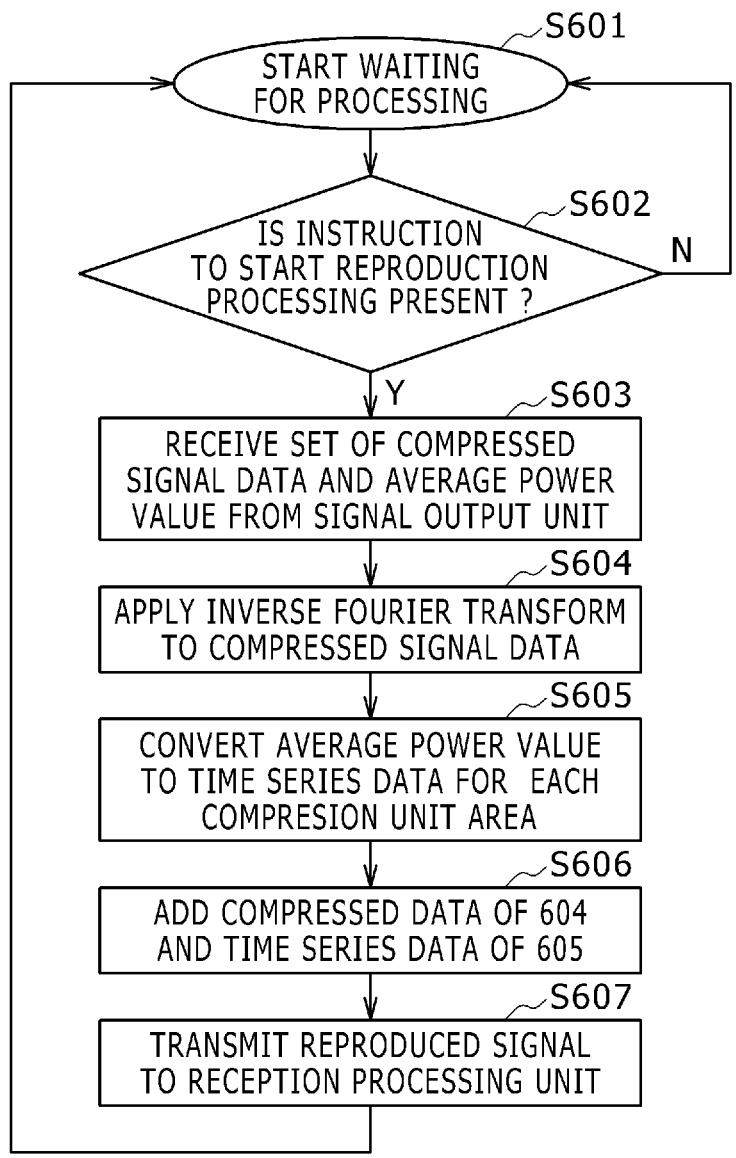
FIG. 6 is a flowchart for describing a processing operation example of a signal reproducing unit of the wireless communication device of the embodiment 2.

FIG. 6 shows one example of a processing operation procedure of the signal reproducing unit 309 in the wireless communication device of FIG. 3. After being powered on, the wireless communication device 106 starts a standby state for a reproduction processing instruction (process S601). When there is no instruction to start the reproduction. processing (N of process S602), the signal reproducing unit 309 returns to the processing waiting (process S601).

When the reproduction processing instruction is issued (Y of process S602), the signal reproducing unit 309 starts the reproduction processing. First, the signal reproducing unit 309 receives compressed signal data 402 and an average power value N from the signal output unit 308 (process S603). Next, inverse Fourier transform is applied to the compressed signal data 402 to obtain a time domain data string 404 (process S604). Next, one or more average power values N are converted to a non-signal data string 405 (process S605). Next, the time domain data string 404 in the process S604 and the non-signal data string 405 in the process S605 are added (process S606). A data string 406 added in the process S606 is taken to be a reproduced signal and sent to the reception processing unit 304 (process S607).

In accordance with the processing operation described above, the wireless communication device 106 according to the embodiment 1 is capable of generating the compressed, signal in which the information amount of the received signal is reduced.

Further, it is possible to restore the compressed signal in the form close to the received signal and subject it to the reception processing again. That is, the reproduction processing can be carried out. The compression processing in the present processing operation makes it possible to realize the compression ratio of information larger than where the normal information compressing means is used, and restore the compressed signal in the form close to the original signal, whereby the reproduction processing can be achieved.

This is realized in the procedure and configuration in which a necessary information amount and an unnecessary information amount are determined within the received signal. Thereafter, the necessary is held as it is and the unnecessary is significantly reduced in regards to that information amount.

The need for the reproduction processing will be described here. There is a characteristic that it is very difficult to reproduce the communication situation because the propagation environment changes momentarily in the wireless communication. For this problem, it is possible to subject the same signal to the reception processing several times by means of the reproduction processing. That is, the reproduction of the wireless communication situation, which had been difficult in general, is possible with the present configuration and processing operation.

Moreover, in a system where such a wireless device is used, for example, there was a need to record and accumulate a large number of waveform data of one day or more, and a problem was to reduce that information amount. The present configuration and the processing operation make it possible to record and analyze the status of wireless communication used in a practical system.

Embodiment 3

Figure 7:
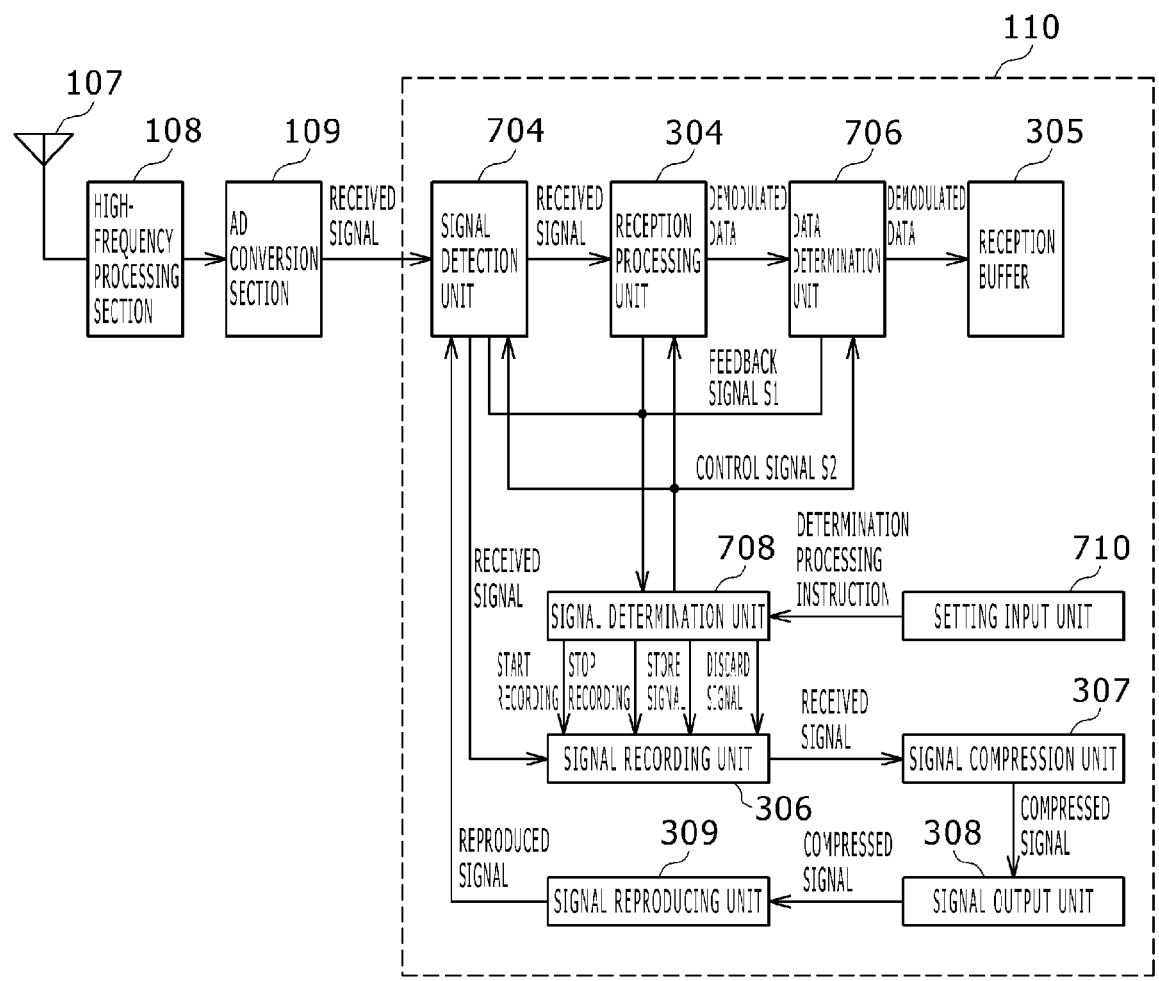
FIG. 7 is a diagram showing a functional configuration example of a wireless communication device of an embodiment 3.

FIG. 7 shows an overall configuration of a wireless communication device 106 according to an embodiment 3 and its input/output. The wireless communication device 106 shown in FIG. 7 is comprised of an antenna 107, a high-frequency processing section 108, an AD conversion section 109 and a reception processing section 110.

In particular, the reception processing section 110 is comprised of a signal detection unit 704, a reception processing unit 304, a date determination unit 706, a reception buffer 305, a signal determination unit. 708, a signal recoding unit 306, a setting input unit 710, a signal compression unit 307, a signal output unit 308, and a signal reproducing unit 309.

The signal detection unit 704 receives a digital received signal from the AD conversion section 109 and detects the feature quantity of the received signal. The data determination unit 706, after receiving the data demodulated from the received signal at the reception processing unit 304, determines if the demodulated data is correct or incorrect and further determines characteristics of a communication period.

The signal determination unit 708 is connected to the signal detection unit 704, the reception processing unit 304 and the data determination unit 706 by way of a feedback signal S1 and a control signal S2. The feedback signal S1 transfers a result of detection and determination of each block to the signal determination unit 708. The control signal S2 transmits the setting of a threshold used in the detection and determination and a processing execution instruction to each block.

Further, the signal determination unit 708 issues four kinds of signals of 'start recording', 'stop recording', 'store signal' and 'discard signal' to the signal recording unit 306.

Furthermore, the signal determination unit 708 receives a determination processing instruction from the setting input unit 710 and starts processing described in the determination processing instruction. In accordance with the contents of the determination processing instruction, the signal determination unit 708 transmits and receives the feedback signal S1 and the control signal and each signal for the 'start recording', 'stop recording', 'store signal' and 'discard signal.'

The signal recording unit 306 receives the received signal from the signal detection unit 704 and records it therein. Further, the signal recording unit 306 receives the 'start recording', 'stop recording', 'store signal' and 'discard signal' from the signal determination unit 708 and performs processing according to the type of signal.

The setting input unit 710 is an input unit which receives a determination processing instruction from a user and transmits it to the signal determination unit 708.

The signal compression unit 307 performs compression processing on the received signal that was recorded at the signal recoding unit 306.

The signal output unit 08 is an output unit which receives the signal received from the signal recording unit 306 or the signal compression unit 307 and stores it therein or outputs it to a display screen.

The signal reproducing unit 309 receives the compressed signal from the signal output unit 308, performs restoration processing of the received signal to the compressed signal and sends it to the signal detection unit again.

The above configuration makes it possible to select any desired wireless signal from within various signals and record tore it. It is also possible to perform compression and reproduction processing on the recorded signal.

Specifically, the conditions and processing for detecting the feature quantity of the wireless signal to be recorded are described in the determination processing instruction and input from the setting input unit 710 in advance. The signal determination unit 708 is operated. in. conjunction with the signal detection unit 704, the reception processing unit 304 and the data determination unit 706 in accordance with the set determination processing instruction to make it possible to determine the arrival of the wireless signal to be recorded.

Upon determining the arrival of the wireless signal to be recorded, the signal determination unit 708 issues an instruction to record the wireless signal to the signal recording unit 306. It is possible to record the wireless signal through this series of processing. In particular, through the determination as to the signal recording processing with the use of the feedback signal S1 transmitted from the signal detection unit 704, detection processing can be performed on the received signal immediately after the reception, the signal not being subjected to the signal processing yet.

As a result, it is possible to appropriately select a desired received signal and record it. Similarly, through the determination of the signal recording processing with the use of the feedback signal transmitted from the data determination unit 706, it is possible to make a determination of signal recording using data after demodulation and decoding processing. Thus, such processing of saving the recorded signal or discarding it is possible in accordance with the result of determination as to whether a data bit string after decoding was normal or contained errors, for example.

The choice of saving the normal data or saving the abnormal data depends on the purpose of the user of the present device. If the purpose is to confirm that communication is being done with no problem, for example, recording and storing the normal data is an objective.

On the other hand, if the purpose is to analyze the cause of the case where the communication is abnormal, recording and storing the abnormal data is an objective. As described above, the present configuration is for providing a wireless communication device having high convenience for a plurality of users different in terms of the purpose of recording and storing each signal.

Figure 8:
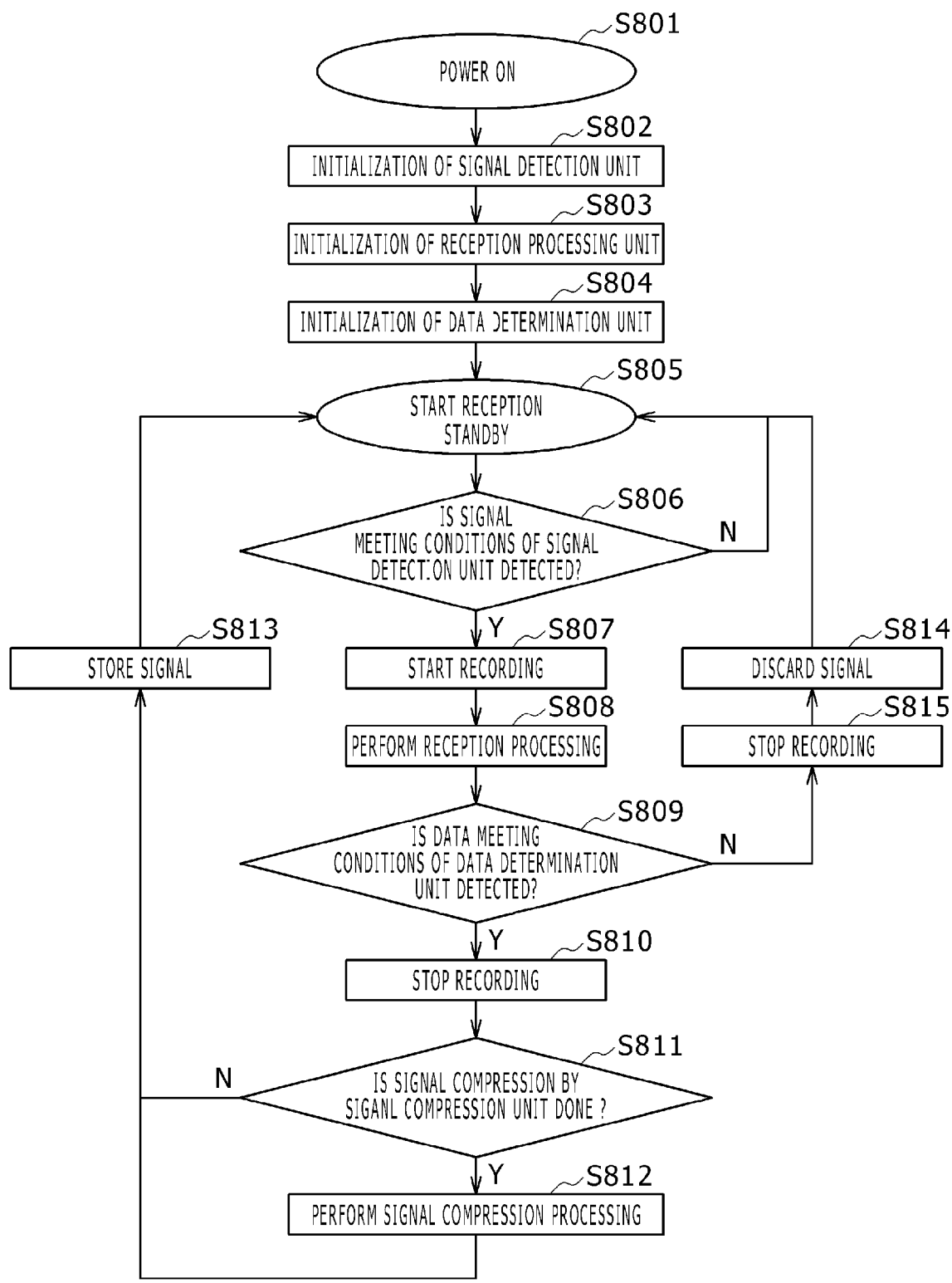
FIG. 8 is a flowchart for describing a processing operation example of the wireless communication system of the embodiment 3.

FIG. 8 shows one example of a processing operation procedure in the wireless communication device 106 of FIG. 7.

After the wireless communication device 106 is powered on (process S801), various initial settings will be made. Initialization (process S802) of the signal detection. unit 704 is intended to set −80 dBm as a threshold for detecting a power value, for example. Initialization (process S803) of the reception processing unit 304 is intended to set whether to notify the result of equalization processing, for example. Initialization (process S804) of the data determination unit 706 makes the setting so as to detect abnormal data and ignore normal. data, for example.

When the above initialization is completed, the wireless communication. device 106 starts a reception standby state (process S805). When the wireless signal arrives, the signal detection unit 704 determines whether it meets the conditions set through the initialization (process S806). When it does not meet the conditions (N of process S806), the reception standby is continued (process S805). When it meets the conditions (Y of process S806), the signal recording is started (process S807).

Next, the reception processing unit 304 performs each reception processing of, for example, synchronization, equalization, demodulation and decoding as reception processing (process S808).

Next, the data determination unit 706 determines whether the demodulated. data meets the conditions (process S809). For example, when the demodulated data is normal (N of process S808), the stop recording (process S815) and the discard signal (process S814) are conducted to shift to the standby state of the process S805. When the demodulated. data is abnormal (Y of process S808), the signal recording is stopped (process S810), but the process of saving the signal is conducted without signal being discarded.

Specifically, upon receiving a signal compression instruction (Y of process S811), the signal compression unit 309 performs the compression processing of the signal (process S812) and stores the signal (process S813). If the signal compression unit 309 does not receive the compression instruction (N of process S811), it may directly store the signal without performing the compression processing (process S813).

That is a series of processing so far to record and compress one wireless signal, after which the wireless communication device returns to the reception standby state (process S805). These are all the compression processing operations in the configuration of FIG. 7, The reproduction processing operation in the configuration of FIG. 7 can obtain a similar advantage through the same processing Operation as the reproducing operation shown in FIG. 6.

The above processing operations make it possible to select and record only the wireless signal suitable for the conditions set in advance and discard the wireless signal unsuitable for the conditions. This signal selecting function makes it possible to greatly reduce the information amount by not recording the unnecessary signals and further reduce the information amount by performing the compression processing on the selected and recorded signals.

Embodiment 4

Figure 9:
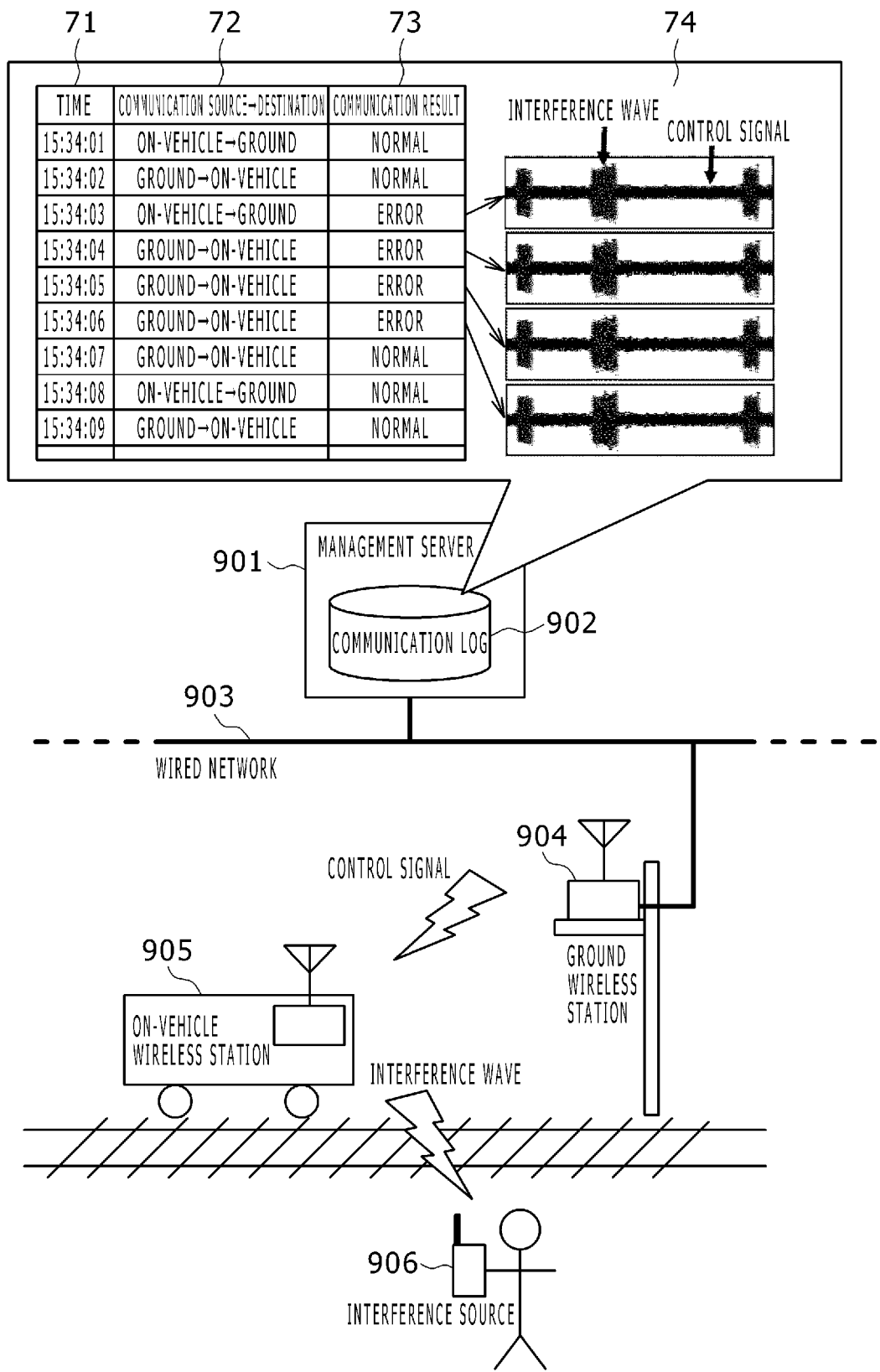
FIG. 9 is a diagram showing a functional configuration example of an accident cause analysis system configured by the wireless communication device.

Specific application cases of the wireless communication device according to the present invention will now be introduced. An embodiment 4 of FIG. 9 shows an example in which an accident cause analysis system is constructed with the use of the wireless communication device 106 shown in the embodiments 1, 2 and 3. Incidentally, the system is assumed to be applied to a wireless railway control system here, but may be a system in which a mobile, including an automobile and a construction machine, and a ground station communicate with each other, or a wireless system using a fixed station installed in a facility such as a factory and building.

The accident cause analysis system applied to the wireless railway control system includes a management server 901, a communication log 902, a wired network 903, ground wireless station 904, and an on-vehicle wireless station 905, as shown in FIG. 9. However, a wireless station that emits an interference wave which could be a cause of an accident is an interference source 906.

The ground wireless station 904 and the on-vehicle less station 905 are identical in configuration to the wireless communication device 106 shown in the embodiments 1, 2 and 3. The on-vehicle wireless station 905 performs wireless communication with the ground wireless station 904 while moving, the ground wireless station 904 being connected to the management server 901 through the wired network 903. The ground wireless station 904 transmits the compressed signals described in the embodiments 1, 2 and 3 to the management server 901 that records and accumulates those plural compressed signals therein as a communication log 902.

Examples of information contained in the communication log are communication time information 71, information 72 on a communication source and a communication destination, a communication result 73, and reproduced signal data 74. There is shown in FIG. 9 an example in which the compressed data accumulated by the management server 901 is restored on the management server 901 an a signal data string is displayed on a monitor.

It is possible to analyze the situation of wireless communication in the railway control system of FIG. 9 by means of the display of the communication log 902 on the monitor. Specifically, the time 71 at which a communication error occurs, information 72 of a communication destination and a communication source at that time, and waveform information 74 of each wireless signal are visually displayed on the monitor in name values, graphs and the like. For example, the waveform information 74 of the wireless signal is displayed as having taken. the frequency on the longitudinal axis and the time axis on the lateral axis. On the basis of this result, it is possible to confirm that the control signal narrow in frequency bandwidth and the interference wave broad in frequency bandwidth are colliding. It is also understood from this result that the stop accident cause of the railway control system is due to the interference wave emitted from the interference source 906.

The system configuration example of the embodiment 4 makes it possible to determine each error factor of the wireless communication system, which has conventionally been difficult with its determination. Since only the result of the wireless communication was found in the Conventional wireless communication system, identifying its cause had been difficult.

The present configuration makes it possible to directly confirm the waveform data and determine the error factor of wireless communication. Further, such a system had a problem that it is of no practical use because there is a need to accumulate the waveform data over a long period of time and the amount of its information becomes enormous. The present configuration can however provide a practicable wireless communication analysis system which reduces the information amount by selecting only necessary information.

Embodiment 5

Another specific application case of the wireless communication device according to the present invention will be introduced. An embodiment 5 of FIG. 10 shows an example in which a preventive maintenance system is constructed with the use of the wireless communication device shown in the embodiments 1, 2 and 3.

Figure 10:
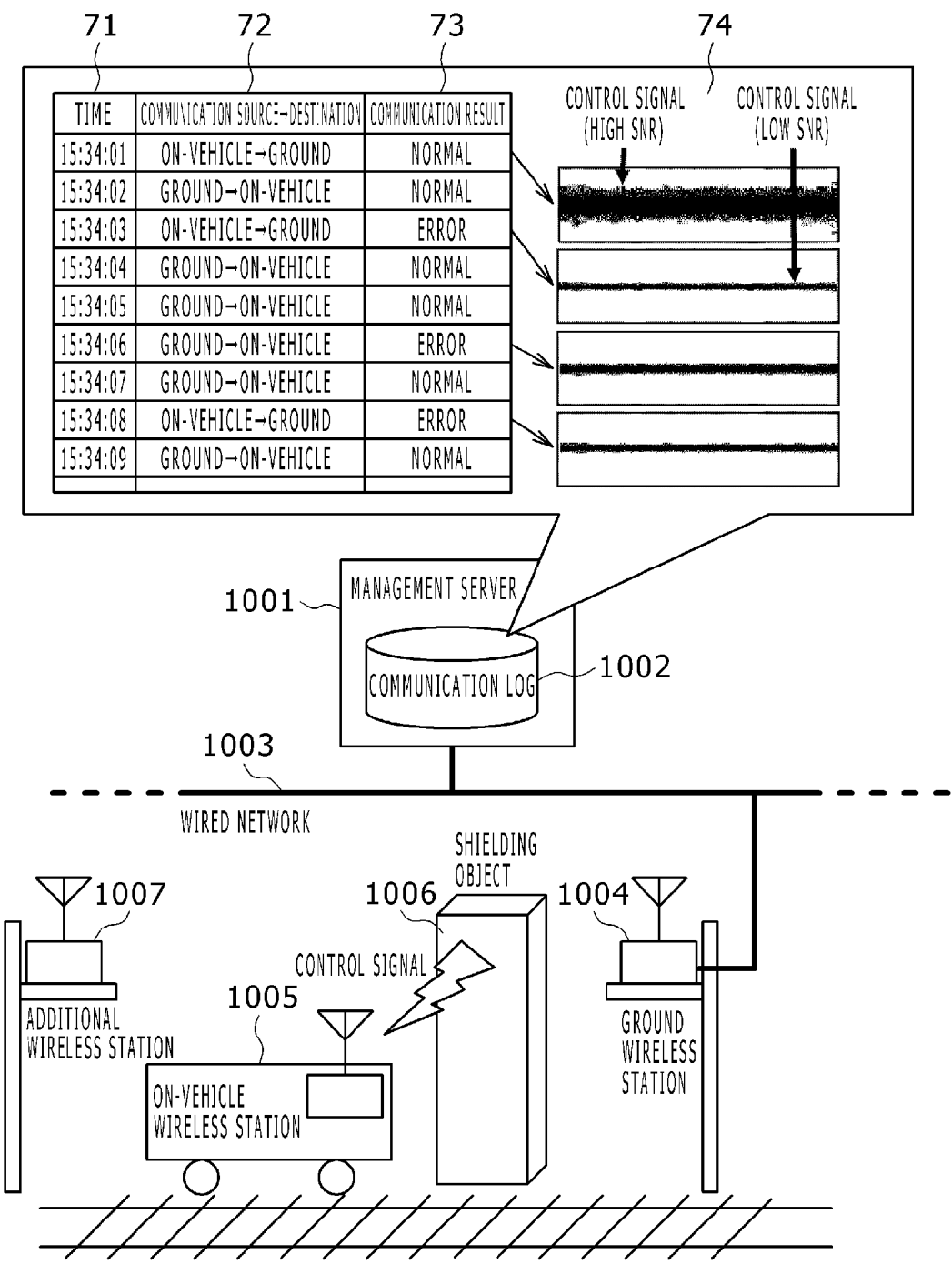
FIG. 10 is a diagram showing a functional configuration example of a preventive maintenance system configured by the wireless communication system.

The preventive maintenance system shown in FIG. 10 is comprised of a management server 1001, a communication log 1002, a wired network 1003, a ground wireless station 1004 and an on-vehicle wireless station 1005. It is assumed that a shielding object 1006 that causes the deterioration of a communication environment exists. Incidentally, the present embodiment is configured as a wireless railway control system, but may be a system in which a mobile, including an automobile and a construction machine, and a ground station communicate with each other, or a wireless system using a fixed station installed in a facility such as a factory and a building.

It is possible to analyze the situation of wireless communication in the system of the embodiment 5 by means of the display of the communication log 1002 in FIG. 10. Specifically, the time 71 at which a communication error occurs, information 72 of a communication destination and a communication source at that time, and waveform information 74 of each wireless signal are visualized. The waveform information of the wireless signal is intended to indicate an amplitude value on the longitudinal axis and a time axis on the lateral axis.

On the basis of this result, it is possible confirm that the S/N ratio of a waveform in which. an error occurs is low, and the S/N ratio is high when it is normal. It is also found from this result that the cause of occurrence of an error is S/N ratio degradation due to the shielding object 1006.

The device in this embodiment functions as a preventive maintenance system as soon as it detects a situation in which the percentage of a communication error is increasing, the communication error being caused due to construction of a new shielding object, the situation not being accompanied with an accident that leads to a system shutdown. In this example, it is possible to take measures such as newly installing an additional wireless station 1007 in accordance with the analysis result of the communication log 1002.

According to the system configuration. example of the embodiment 5, it is possible to preventively correspond to a change in the situation of wireless communications aft quick inference of the change which is not likely to be the direct cause of a serious accident but is expected to result in the cause of an accident in the future. Thereby a social infrastructure system which is safer and more secure can be realized.

DESCRIPTION OF REFERENCE NUMERALS

101: input signal
102: signal portion
103: non-signal area 1
104: non-signal area 2
105: non-signal area 3
106: wireless communication device
107: antenna
108: high-frequency processing section
109: AD conversion section
110: signal processing section
111: output signal
112: signal portion
113: representative value of non-signal area 1
114: representative value of non-signal area 2
115: representative value of non-signal area 3
304: reception processing unit
305: reception buffer, 306: signal recoding unit
307: signal compression unit
308: signal output unit
309: signal reproducing unit
401: time domain data string
402: frequency domain data string
403: non-signal portion data
404: time domain data string
405: non-signal portion data string
406: reproduced signal data string
701: antenna
702: high-frequency processing section
703: AD conversion section
704: signal detection unit
706: data determination unit
707: reception buffer
708: signal determination unit
710: setting input unit
901: management server
902: communication log
903: wired network
904: ground wireless station
905: on-vehicle wireless station
906: interference source
1001: management server
1002: communication log
1003: wired network
1004: ground wireless station
1005: on-vehicle wireless station
1006: shielding object
1007: additional wireless station.

The invention claimed is:

1. A signal processing device by use of wireless communication, comprising:
a reception processing unit that performs reception processing of a received signal wirelessly;
a signal recording unit that records the signal;
a signal compression unit that compresses an information amount of the received signal; and
a signal output unit that stores the received signal that has been compressed or outputs the received signal to an external device,
wherein the signal compression unit divides a signal, obtained by frequency-transforming a wireless received signal, into a signal portion large in amplitude value and a non-signal portion small in amplitude value on a frequency spectrum, calculates a representative value based on a feature quantity of the non-signal portion and combines the signal portion and the representative value into a compressed signal; and
a signal reproducing unit that restores the information amount of the compressed received wireless signal close to that of the received wireless signal,
wherein the signal reproducing unit adds a first signal and a second signal to obtain a reproduced signal of the received signal, the first signal being obtained by way of inverse transform on frequency of the signal portion, the second signal having an amplitude on a time axis obtained from the representative value of the non-signal portion.

2. The signal processing device by use of wireless communication according to claim 1, wherein the reproduced signal is input to the reception processing unit, the signal being reproduced at the signal reproducing unit.

3. A signal processing method by use of wireless communication according to claim 1, comprising:
distinguishing a plurality of non-signal portions in accordance with a difference in the feature quantity between the non-signal portions;
calculating a plurality of representative values based on feature quantities of the plurality of non-signal portions, the respective feature quantities being different; and
outputting the signal portion and the plurality of representative values as a compressed signal.

4. A signal processing device by use of wireless communication, comprising:
a reception processing unit that performs reception processing of a received signal wirelessly;
a signal recording unit that records the signal;
a signal compression unit that compresses an information amount of the received signal; and
a signal output unit that stores the received signal that has been compressed or outputs the received signal to an external device,
wherein the signal compression unit divides a signal, obtained by frequency-transforming a wireless received signal, into a signal portion large in amplitude value and a non-signal portion small in amplitude value on a frequency spectrum, calculates a representative value based on a feature quantity of the non-signal portion and combines the signal portion and the representative value into a compressed signal; and
wherein the signal compression unit separates a signal and a non-signal portion on a basis of the amount of an amplitude value of the frequency-transformed signal, the signal being obtained by frequency-transforming the received signal into a signal portion, calculates an average power value of the non-signal portion and outputs the signal portion and the average power value as a compressed signal.

5. The signal processing device by use of wireless communication according to claim 4, wherein the signal reproducing unit subjects the signal portion of the compressed signal to frequency inverse transform, converts the average power value to non-signal portion data and adds the compressed signal subjected to the frequency inverse transform and the non-signal portion data to obtain a reproduced signal.

6. A signal processing device by use of wireless communication, comprising:
- a reception processing unit that performs reception processing of a received signal wirelessly;
- a signal detection unit that detects a feature quantity of the received signal;
- a data determination unit that determines if the received signal is correct or incorrect and further determines characteristics thereof;
- a setting input unit that inputs wireless signal conditions;
- a signal determination unit that determines whether the received signal meets the wireless signal conditions;
- a signal recording unit that records the received signal;
- a signal compression unit that compresses an information amount of the received signal that was recorded;
- a signal output unit that stores the compressed signal or outputs the signal to the outside; and
- a signal reproducing unit that restores an information amount of the compressed signal to that of the received signal and inputs the restored information amount to the signal detection unit,
- wherein when the signal determination unit determines that the received signal meets the wireless signal conditions, the signal recording unit records the received signal, the signal compression unit compresses the information amount of the received signal that was recorded, and outputs the compressed received signal to the signal output unit, and the signal reproducing unit restores the information amount of the compressed received signal and inputs the restored received signal to the reception processing unit.

7. The signal processing device by use of wireless communication according to claim 6, wherein the setting input unit inputs a determination processing instruction descriptive of a processing procedure for determining the wireless signal meeting the wireless signal conditions, or an execution instruction of compression and reproduction processing to the signal determination unit, and
the signal determination unit determines the wireless signal meeting the wireless signal conditions in accordance with the determination processing instruction, or performs compression and reproduction processing thereon.

8. A signal processing device by use of wireless communication, comprising:
- a reception processing unit that performs reception processing of a received signal wirelessly;
- a signal recording unit that records the signal;
- a signal compression unit that compresses an information amount of the received signal; and
- a signal output unit that stores the received signal that has been compressed or outputs the received signal to an external device,
- wherein the signal compression unit divides a signal, obtained by frequency-transforming a wireless received signal, into a signal portion large in amplitude value and a non-signal portion small in amplitude value on a frequency spectrum, calculates a representative value based on a feature quantity of the non-signal portion and combines the signal portion and the representative value into a compressed signal; and
- a feedback transmission path and a control transmission path that connect the signal detection unit and the reception processing unit to the data determination unit and the signal determination unit,
- wherein the signal determination unit, after driving the signal detection unit, the reception processing unit and the data determination unit by use of the control transmission path, receives results of driving of the signal detection unit, the reception processing unit and the data determination unit by use of the feedback transmission path to thereby perform a process of determining the wireless signal meeting the wireless signal conditions or a process of compressing or reproducing the wireless signal.

9. A signal processing method by use of wireless communication, comprising:
- dividing a signal into a signal portion large in amplitude value and a non-signal portion small in amplitude value on a frequency spectrum, the signal being obtained by frequency-transforming a wireless received signal;
- calculating a representative value on a basis of a feature quantity of the non-signal portion;
- outputting the signal portion and the representative value as a compressed signal; and
- adding a first signal and a second signal to reproduce the received signal, the first signal being obtained by way of inverse transform on the frequency of the signal portion, the second signal having an amplitude on a time axis obtained from the representative value of the non-signal portion.

* * * * *